United States Patent
Ruby et al.

(10) Patent No.: US 7,312,675 B2
(45) Date of Patent: *Dec. 25, 2007

(54) VERTICALLY SEPARATED ACOUSTIC FILTERS AND RESONATORS

(75) Inventors: Richard C. Ruby, Menlo Park, CA (US); John D. Larson, III, Palo Alto, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 11/373,355

(22) Filed: Mar. 9, 2006

(65) Prior Publication Data

US 2006/0152305 A1    Jul. 13, 2006

Related U.S. Application Data

(63) Continuation of application No. 10/785,525, filed on Feb. 23, 2004, now Pat. No. 7,038,559.

(51) Int. Cl.
*H03H 9/54*    (2006.01)
(52) U.S. Cl. ...................... 333/189; 333/187
(58) Field of Classification Search ........... 333/187, 333/189
See application file for complete search history.

(56) References Cited

U.S. PATENT DOCUMENTS

| | | | |
|---|---|---|---|
| 3,568,108 A | 3/1971 | Poirier et al. | |
| 4,058,745 A | 11/1977 | Otto | |
| 5,185,589 A | 2/1993 | Krishnaswamy et al. | |
| 5,587,620 A | 12/1996 | Ruby et al. | |
| 5,801,603 A * | 9/1998 | Yamamoto et al. | 333/189 |
| 5,864,261 A * | 1/1999 | Weber | 333/187 |
| 5,873,153 A | 2/1999 | Ruby et al. | |
| 6,060,818 A | 5/2000 | Ruby et al. | |
| 6,228,675 B1 | 5/2001 | Ruby et al. | |
| 6,265,246 B1 | 7/2001 | Ruby et al. | |
| 6,376,280 B1 | 4/2002 | Ruby et al. | |
| 6,384,697 B1 | 5/2002 | Ruby | |
| 6,429,511 B2 | 8/2002 | Ruby et al. | |
| 6,466,107 B2 * | 10/2002 | Yamamoto | 333/189 |
| 6,635,519 B2 * | 10/2003 | Barber et al. | 438/151 |
| 6,670,866 B2 | 12/2003 | Ella et al. | |
| 6,720,844 B1 | 4/2004 | Lakin | |
| 6,762,471 B2 * | 7/2004 | Kim | 257/414 |
| 6,917,261 B2 | 7/2005 | Unterberger | |

(Continued)

FOREIGN PATENT DOCUMENTS

EP    1 482 838 A3    12/2004

(Continued)

OTHER PUBLICATIONS

Examination Report dated Oct. 24, 2006 involving counterpart UK Patent Application No. GB0501315.6.*

*Primary Examiner*—Barbara Summons

(57) ABSTRACT

An apparatus including vertically separated acoustic resonators are disclosed. The apparatus includes a first acoustic resonator on a substrate and a second acoustic resonator vertically separated above the first acoustic resonator. Because the resonators are vertically separated above another, total area required to implement the resonators is reduced thereby savings in die size and cost are realized. The vertically separated resonators are supported by standoffs that are fabricated on the substrate, or on a resonator.

18 Claims, 5 Drawing Sheets

U.S. PATENT DOCUMENTS

| | | |
|---|---|---|
| 7,038,559 B2 * | 5/2006 | Ruby et al. ............... 333/189 |
| 2002/0109564 A1 * | 8/2002 | Tsai et al. ............... 333/187 |
| 2003/0128081 A1 | 7/2003 | Ella et al. |
| 2004/0029356 A1 | 2/2004 | Timme et al. |
| 2004/0164367 A1 | 8/2004 | Park |
| 2005/0012571 A1 * | 1/2005 | Song et al. ............... 333/192 |

FOREIGN PATENT DOCUMENTS

| | | |
|---|---|---|
| GB | 2421381 A | 6/2006 |
| WO | WO 02/058233 A1 | 7/2002 |
| WO | WO2005/043753 A1 | 5/2005 |

* cited by examiner

VERTICALLY SEPARATED ACOUSTIC FILTERS AND RESONATORS

CROSS-REFERENCE TO RELATED APPLICATION

This continuation application claims the benefit under 35 U.S.C. Section 120 of U.S. patent application Ser. No. 10/785,525, entitled "Vertically Separated Acoustic Filters And Resonators" by Richard C. Ruby and John D. Larson, III filed Feb. 23, 2004 now U.S. Pat. No. 7,038,559 which is incorporated herein by reference.

BACKGROUND

The present invention relates to acoustic resonators, and more particularly, to resonators that may be used as filters for electronic circuits.

The need to reduce the cost and size of electronic equipment has led to a continuing need for ever smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filters that has the potential for meeting these needs is constructed from thin film bulk acoustic resonators (FBARS). These devices use bulk longitudinal acoustic waves in thin film piezoelectric (PZ) material. In one simple configuration, a layer of PZ material is sandwiched between two metal electrodes.

The sandwich structure is preferably suspended in air by a support structure. When electric field is applied between the metal electrodes, the PZ material converts some of the electrical energy into mechanical energy in the form of mechanical waves. The mechanical waves propagate in the same direction as the electric field and reflect off of the electrode/air interface.

At a resonant frequency, the device appears to be an electronic resonator. When two or more resonators (with different resonant frequencies) are electrically connected together, this ensemble acts as a filter. The resonant frequency is the frequency for which the half wavelength of the mechanical waves propagating in the device is equal to the total thickness of the device for a given phase velocity of the mechanical wave in the material. Since the velocity of the mechanical wave is four orders of magnitude smaller than the velocity of light, the resulting resonator can be quite compact.

In designing and building miniature filters for microwave frequency usage, it is often necessary to provide multiple interconnected resonators (for example, FBARS) fabricated on a die. FIG. 1 is a schematic diagram showing a portion 10 of a filter circuit. For convenience, the illustrated portion is referred to herein as the "filter circuit" 10. The filter circuit 10 includes a plurality of interconnected resonators. Referring to FIG. 1, some of the illustrated resonators are connected in series and are referred to as series resonators 12, 14, and 16 while other illustrated resonators are connected in parallel and are referred to as shunt resonators 22, 24, 26, and 28. The filter circuit 10 connects to external circuits (not illustrated) via connection points 11, 13, 15, 17, 19, and 21.

FIG. 2 shows a top view of a die 20 illustrating topology of the resonators of the filter circuit 10 FIG. 1 as they are typically implemented on the die 20. In FIGS. 1 and 2, corresponding resonators are illustrated with same reference numerals. Connection points of FIG. 1 are illustrated as connection pads in FIG. 2 and corresponding connection points and connection pads are illustrated with same reference numerals.

As illustrated, the die 20 requires a die area (defined by the first and second dimensional extents illustrated as X-axis extent 23 and Y-axis extent 25) to implement the resonators. Die area is a scarce and expensive resource in many electronic devices, for example, wireless communication devices such as cellular telephones. It is desirable to be able to implement the filter circuit 10 on a smaller die allowing for manufacture of smaller and less costly devices.

SUMMARY

The need is met by the present invention. In a first embodiment of the present invention, an apparatus includes a first acoustic resonator on a substrate and a second acoustic resonator vertically separated above the first acoustic resonator such that little or no acoustic energy is coupled between the first acoustic resonator and the second acoustic resonator. Because the resonators are vertically separated, they require less die space resulting in smaller and more area efficient and cost effective implementation of the apparatus.

In a second embodiment of the present invention, an apparatus includes a plurality of resonators fabricated on a substrate where a first acoustic resonator is fabricated on the substrate and a second acoustic resonator is vertically separated and acoustically separated above the first acoustic resonator.

In a third embodiment of the present invention, a method of fabricating an apparatus is disclosed. First, a first resonator is fabricated on a substrate. Then, a sacrificial layer is fabricated surrounding the first resonator. Standoffs are fabricated. Next, a second resonator is fabricated on the sacrificial layer above the standoffs. Finally, all the sacrificial layer are removed.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the FIGS. 1 through 8 which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "above" or "right of" relative to other structures, portions, or both. As will be appreciated by those of skill in the art, relative terms and phrases such as "above" or "right of" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "above" or "right of" other structures or portions would now be oriented "below" or "left of" the other structures or portions.

As shown in the figures for the purposes of illustration, embodiments of the present invention are exemplified by an apparatus having a first acoustic resonator on a substrate and a second acoustic resonator vertically separated above the first acoustic resonator. Because the resonators are vertically separated above another, total area required to implement the resonators is reduced thereby savings in die size and manufacturing costs are realized.

Figure 1:
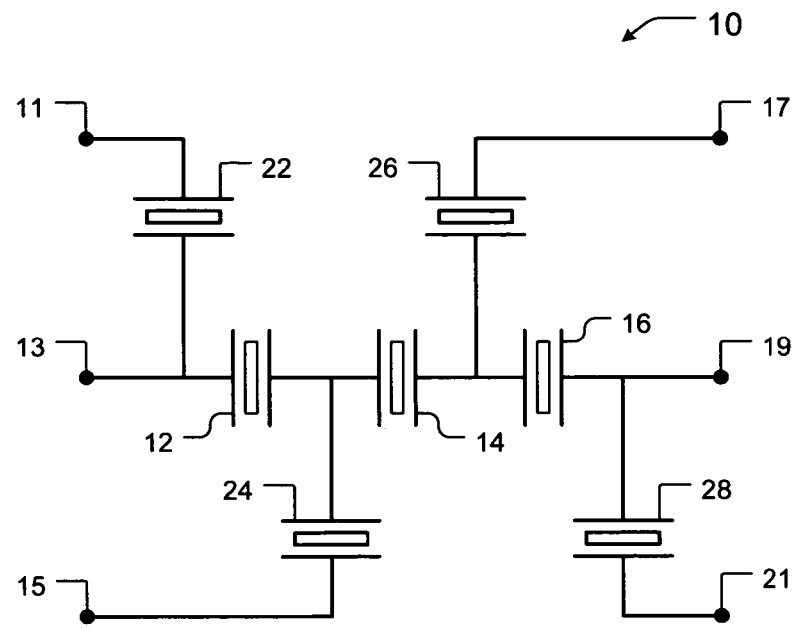
FIG. 1 is a schematic diagram showing a portion of a filter circuit including a plurality of resonators.
Figure 2:
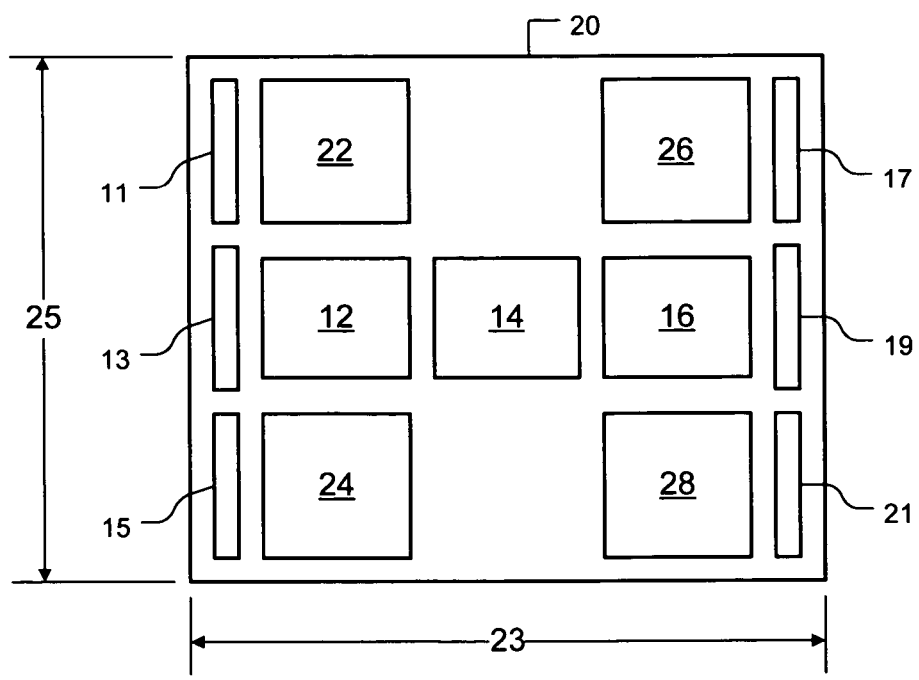
FIG. 2 is a top view of a die implementing the filter circuit of FIG. 1 using prior art topology.
Figure 3:
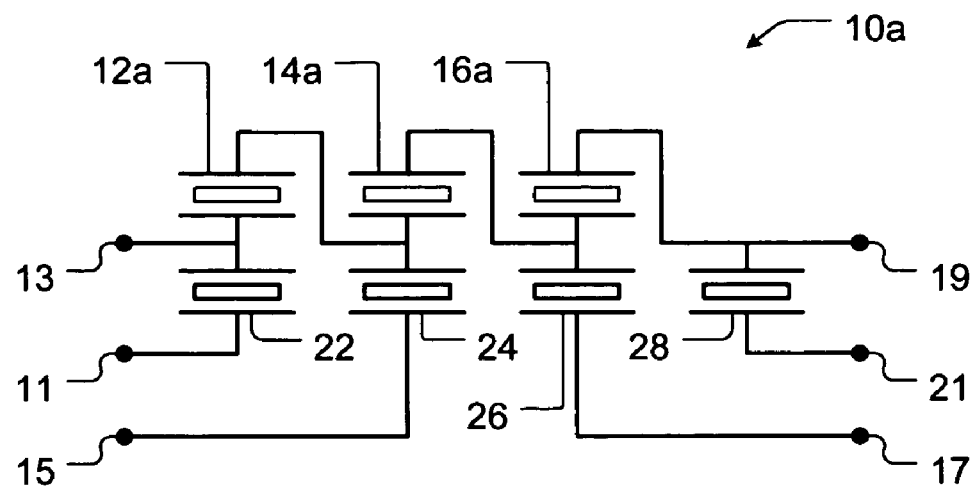
FIG. 3 is a schematic diagram of the filter circuit of FIG. 1 redrawn to emphasize topology of resonators in accordance with one embodiment of the present invention.

FIG. 3 is a schematic diagram of the filter circuit 10 of FIG. 1 redrawn to emphasize topology of resonators in accordance with one embodiment of the present invention. The redrawn filter circuit is designated using reference numeral 10*a*. The filter circuit 10*a* of FIG. 3 includes identical component resonators and connection points as the filter circuit 10 of FIG. 1. Further, operations of the filter circuit 10*a* of FIG. 3 are identical to operations of the filter circuit 10 of FIG. 1. For this reason, same reference numerals are used for the corresponding components in FIGS. 1 and 3 except as follows: in FIG. 3, to more clearly illustrate the vertically separating technique in accordance with the illustrated embodiment of the present invention, series resonators 12, 14, and 16 of FIG. 1 are referred to as series resonators 12*a*, 14*a*, and 16*a* in FIG. 3.

Figure 4:
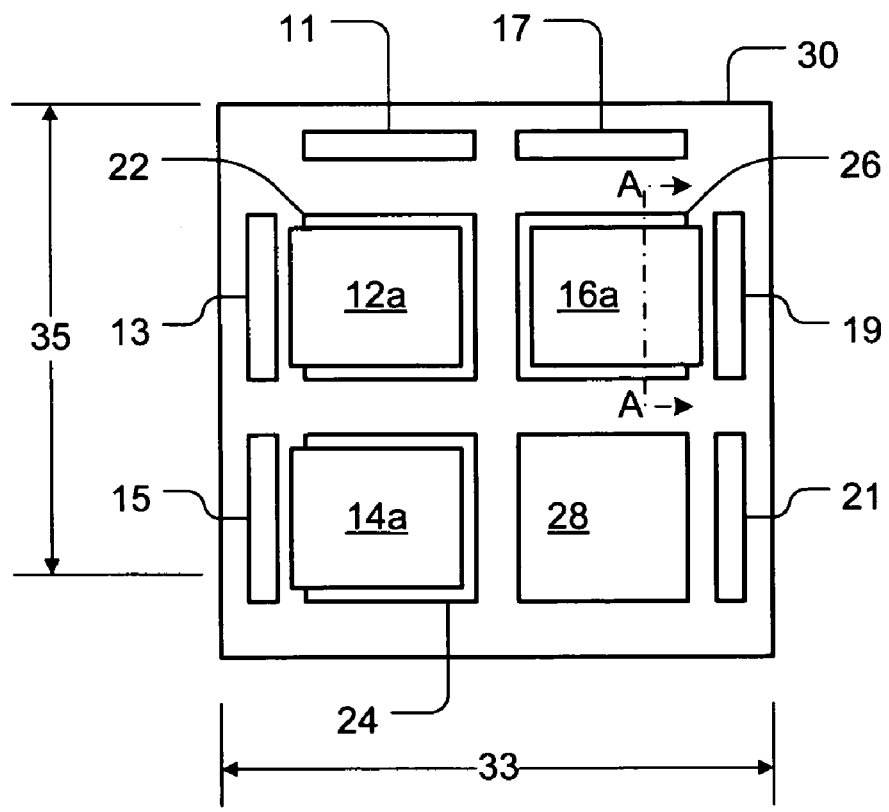
FIG. 4 is a top view of a die implementing the filter circuit of FIG. 3 in accordance with one embodiment of the present invention.
Figure 5:
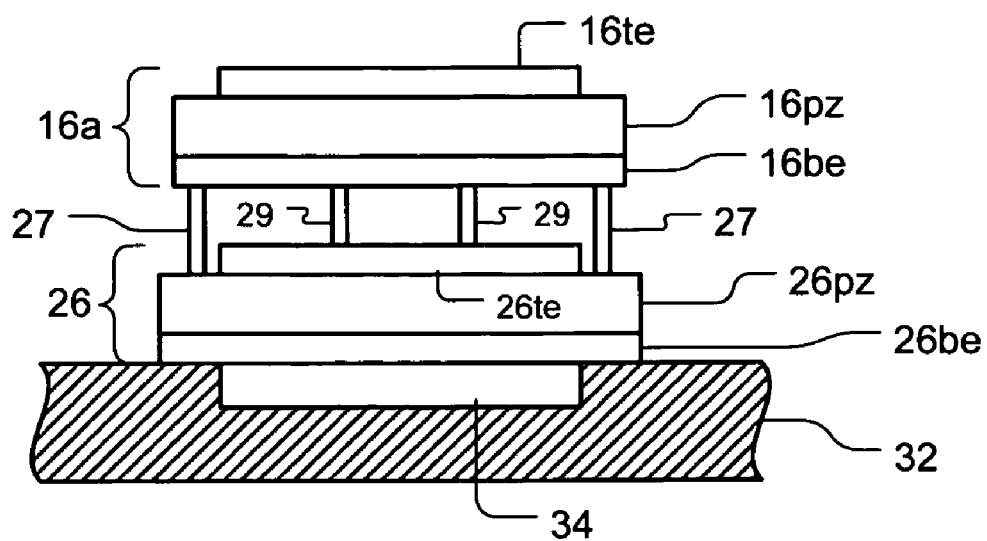
FIG. 5 is a cutaway side view of a portion of the die of FIG. 4 cut along line A—A.

FIG. 4 is a top view of a die 30 implementing the filter circuit 10*a* of FIG. 3 in accordance with one embodiment of the present invention. In FIGS. 3 and 4, corresponding resonators are illustrated with same reference numerals. Connection points of FIG. 3 are illustrated as connection pads in FIG. 4 and corresponding connection points and connection pads are illustrated with same reference numerals. FIG. 5 is a cutaway side view of a portion of the die of FIG. 4 cut along line A—A. For filter circuits filtering electronic signals in the gigahertz frequency range, each of the resonators of the die 30 can have lateral sizes on the order of hundreds of microns or less and thicknesses in the order of microns or less.

Referring to FIGS. 4 and 5, the die 30 includes shunt resonators 22, 24, 26, and 28 fabricated on a substrate 32. In the illustrated embodiment of the present invention, series resonators 12*a*, 14*a*, and 16*a* are fabricated above shunt resonators 22, 24, 26, respectively. For example, the shunt resonator 26 (the first acoustic resonator 26) is fabricated on the substrate 32. The substrate 32 may include a cavity 34 under the first resonator 26. A second resonator, in this case series resonator 16*a*, is vertically separated above said first resonator 26. In the illustrated embodiment, the first and the second resonators 26 and 16*a* are film bulk acoustic resonators (FBARS). The substrate can be, for example, silicon substrate.

The first resonator 26 includes a bottom electrode 26*be* and a top electrode 26*te* sandwiching a piezoelectric layer 26*pz*. Likewise, the second resonator 16*a* includes a bottom electrode 16*be* and a top electrode 16*te* sandwiching a piezoelectric layer 16*pz*. The electrodes of both the first and the second resonators 26 and 16*a* are made from conductive material such as, for example only, Molybdenum. The piezoelectric layer of both the first and the second resonators 26 and 16*a* are made from piezoelectric material such as, for example, Aluminum Nitride.

The second resonator 16*a* is supported by standoffs 27 and is separated and de-coupled from the first resonator 26 mostly by air. The distance between the first resonator 26 and the second resonator 16 can vary widely depending on implementation and can range, for example, from 0.1 microns to 20 microns. In some embodiments, the distance between the first resonator 26 and the second resonator 16 can be maintained using separators 29. In FIG. 5, two separators 29 are illustrate; however, the separators 29 are used to prevent the vertically separated resonators 26 and 16 from touching each other. The separators 29 can be a short pillar or stub fabricated on the top electrode 26*te* of the first resonator 26. The separators 29 are fabricated using similar process and material as the standoffs 27. In the illustrated embodiment, top cross sectional area (the top cross section not illustrated) of the separators 29 are very small compared to the area (partially illustrated in FIG. 4) of the top electrode 26*te* of the first resonator 26 and can be, for example, less than one percent of the area of the top electrode 26*te*.

Because the acoustic resonators 26 and 16 are vertically and acoustically separated, little or no acoustic energy is coupled between the first acoustic resonator 26 and the second acoustic resonator 16.

The standoffs 27 have height that is measured in the order ranging from fractions of microns to tens or even hundreds of microns depending on implementation. Lateral extents of the standoffs can range from 0.5 microns to 100 microns defining a cross sectional area ranging from one micron square to one millimeter square. The separation between the resonators can be but is not necessarily complete. For example, standoff can be fabricated between the two resonators to separate the resonators while the standoff itself can connect small portions of the separated resonators.

The standoffs 27 can be fabricated anywhere under the second resonator 16*a*. In the illustrated embodiment, the standoffs 27 are fabricated on the first resonator 26 and are connected to the bottom electrode 16*be* of the second resonator 16*a*. In particular, in the illustrated embodiment, the standoffs 27 are fabricated on the piezoelectric layer 26*pz* of the first resonator 26. In fact, the standoffs 27 can be fabricated on other portions of the die 30. For instance, the standoffs 27 can be fabricated on the substrate 32 or the top electrode 26*te* of the first resonator 26. The standoffs 27 can be fabricated using the any sufficiently rigid material that is also suitable for integration with the resonator fabrication process such as, for example, tungsten.

The die 30 of FIG. 3 requires an area (defined by the first and second dimensional extents illustrated as X-axis extent 33 and Y-axis extent 35) to implement the resonators. The some resonators of the die 30 are vertically separated above other resonators. For this reason, the die 30 requires less area to implement all of its resonators compared to the die 20 of FIG. 1.

Figure 6:
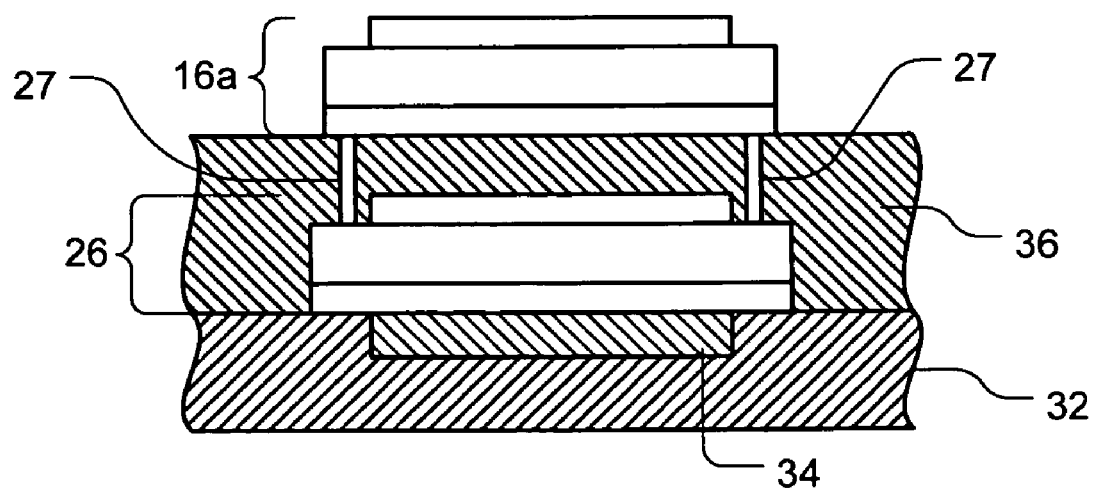
FIG. 6 is a cutaway side view of the portion of the die of FIG. 4 cut along line A—A during its fabrication process.

FIG. 6 is a cutaway side view of the portion of the die 30 of FIG. 5 cut along line A—A during its fabrication process. To fabricate the die 30 including its vertically separated resonators, the first resonator 26 is fabricated on the substrate 32. In the illustrated embodiment, the first resonator 26 is fabricated above the cavity 34. At this stage of the fabrication process, a cavity 34 is filled with some sacrificial material such as, for example, phosphorus silicate glass (PSG). The PSG can be the same material that is used as the sacrificial material for the cavity 34. Then, a sacrificial layer 36 is fabricated surrounding the first resonator 26. The standoffs 27 are also fabricated after the fabrication of the first resonator 26. The sacrificial layer 36 is planarized by polishing using, for example, slurry.

Next, the second resonator 16a is fabricated above the standoffs 27 and also above the sacrificial layer 36. Finally, the sacrificial layer 36 is removed leaving the second resonator 16 supported by the standoffs 27 and suspended above the first resonator 26. To remove the PSG sacrificial layer, hydrofluoric acid can be used.

Figure 7:
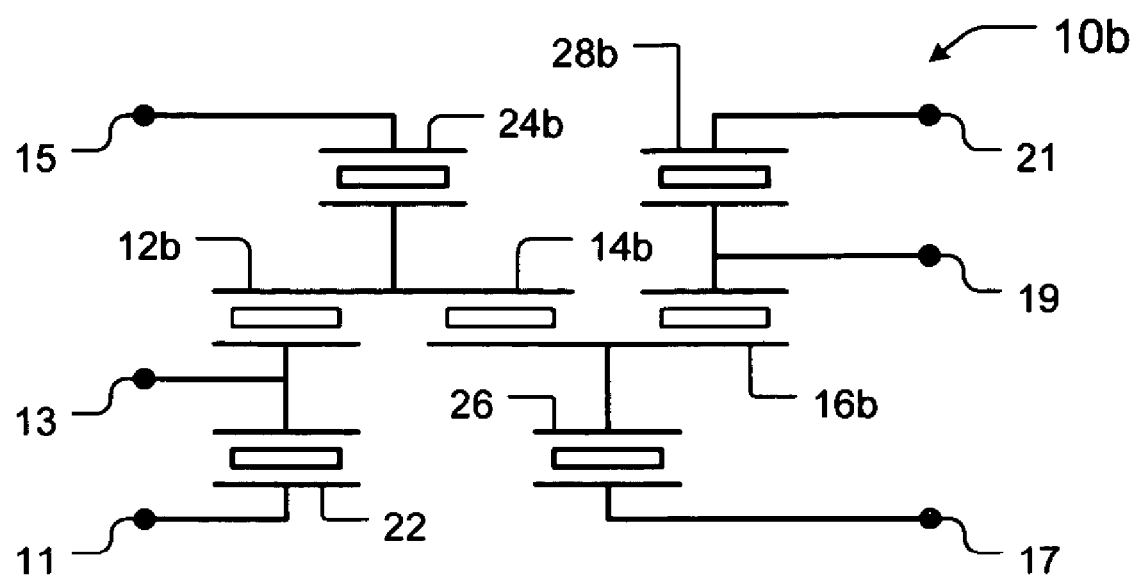
FIG. 7 is a schematic diagram of the filter circuit of FIG. 1 redrawn again to emphasize topology of resonators in accordance with another embodiment of the present invention.

FIG. 7 is a schematic diagram of the filter circuit 10 of FIG. 1 redrawn to emphasize topology of resonators in accordance with another embodiment of the present invention. This redrawn filter circuit is designated using reference numeral 10b. The filter circuit 10b of FIG. 7 includes identical component resonators and connection points as the filter circuit 10 of FIG. 1. Further, operations of the filter circuit 10b of FIG. 7 are identical to operations of the filter circuit 10 of FIG. 1. For this reason, same reference numerals are used for the corresponding components in FIGS. 1 and 7 except as follows: in FIG. 7, to more clearly illustrate the vertically separating technique in accordance with the illustrated embodiment of the present invention, resonators 12, 14, 16, 24, and 28 of FIG. 1 are referred to as resonators 12b, 14b, 16b, 24b, and 28b in FIG. 7.

Figure 8:
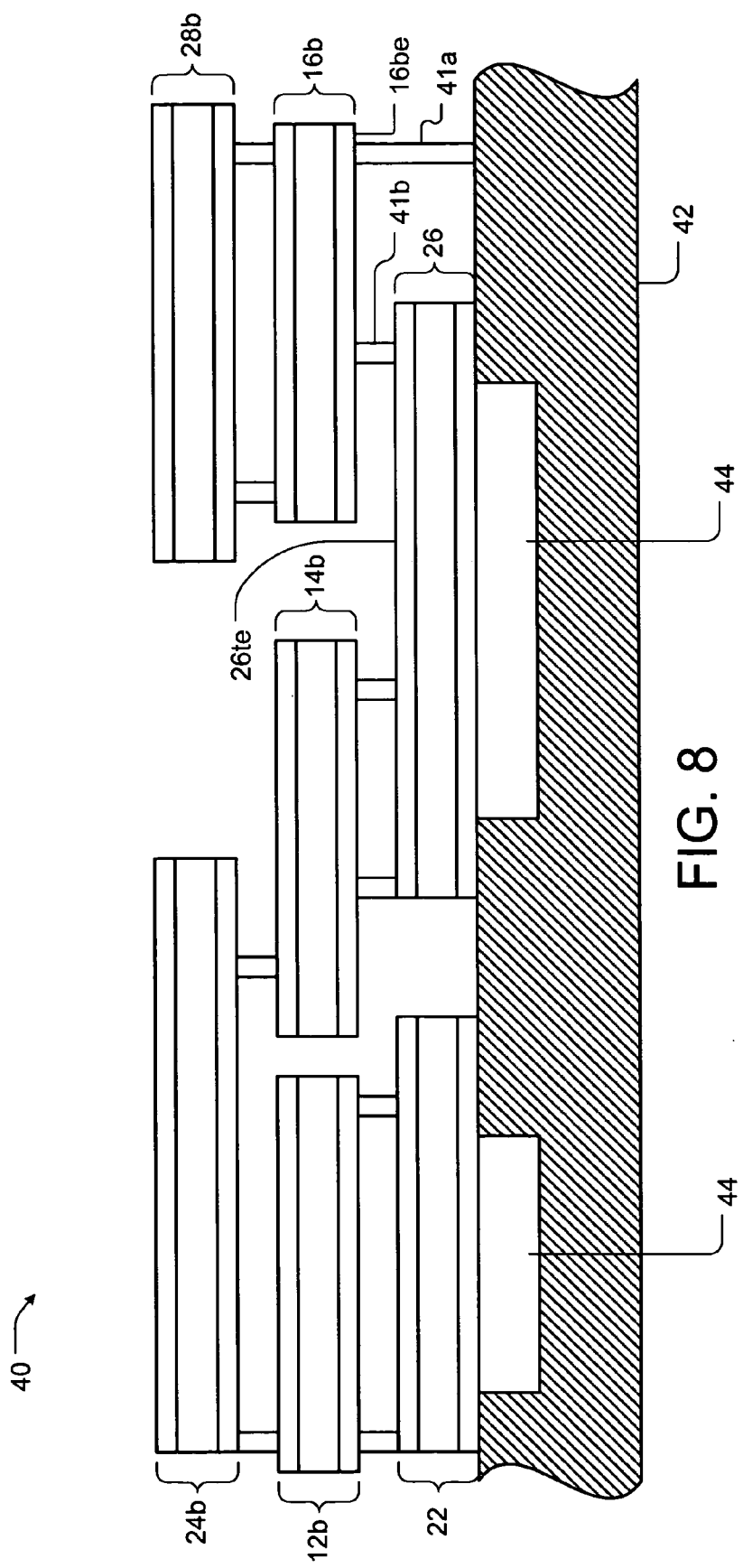
FIG. 8 is a cutaway side view of a die implementing the filter circuit of FIG. 7.

FIG. 8 is a cutaway side view a portion of a die 40 implementing the filter circuit 10b of FIG. 7 in accordance with the other embodiment of the present invention illustrating additional aspects of the present invention. In FIGS. 7 and 8, corresponding resonators are illustrated with same reference numerals.

Referring to FIGS. 7 and 8, in the illustrated embodiment, the die 40 includes shunt resonators 22 and 26 fabricated on a substrate 42. Series resonators 12b, 14b, and 16b are fabricated vertically separated above the shunt resonators 22 and 26. Further, shunt resonators 24b and 26b are fabricated vertically separated above the series resonators 12b, 14b, and 16b. As before the substrate 42 may include cavities 44 under the resonators 22 and 26. Vertically separated above a first resonator 26 is a second resonator 16b. In the illustrated embodiment, the first and the second resonators 26 and 16b are film bulk acoustic resonators (FBARS). Here, a third resonator 28b is fabricated above the second resonator 16b. Because of additional vertically separating of the resonators, the die 40 of FIG. 8 requires even less space then the die 30 of FIG. 4.

FIG. 8 illustrates additional aspects of the present invention. In FIG. 8, standoffs for supporting vertically separated resonators are designated using reference numeral 41 followed by a letter beginning with letter "a." Not all standoffs are thus designated. In the illustrated embodiment, one of the standoffs, standoff 41a, is fabricated on the substrate 42 while others such as standoff 41b are fabricated on top electrodes of lower resonators. In fact, the standoff 41b is situated between top electrode 26te of the first resonator 26 and bottom electrode 16be of the second resonator 16b and mechanically connects the top electrode 26te of the first resonator 26 to the bottom electrode 16be of the second resonator 16b.

If the standoff 41b is made from electrically conductive material such as, for example, tungsten or even Molybdenum, the same material as the electrodes, then the top electrode 26te of the first resonator 26 and the bottom electrode 16be of the second resonator 16b are electrically connected. Alternatively, if the standoff 41b is made from electrically insulating material, then the top electrode 26te of the first resonator 26 and the bottom electrode 16be of the second resonator 16b are electrically separated from each other and may have different electrical potential relative to each other. In this case, a capacitive potential is created between the top electrode 26te of the first resonator 26 and the bottom electrode 16be of the second resonator 16b. For electrical separation, the standoffs 41b can be made from electrically conducting material such as Tungsten or Molybdenum, or insulating or semi-insulating materials such as silicon nitride or polysilicon.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. An apparatus comprising:
   a first film bulk acoustic resonator (FBAR) on a substrate;
   a second FBAR above said first FBAR, said second FBAR being vertically separated from said first FBAR such that little or no acoustic energy is coupled between said first FBAR and said second FBAR;
   at least one standoff fabricated directly on said first FBAR, said standoff supporting said second FBAR; and
   wherein said standoff electrically connects said first acoustic resonator and said second acoustic resonator.

2. The apparatus recited in claim 1
   wherein said first FBAR includes a bottom electrode and a top electrode sandwiching a piezoelectric layer; and
   wherein said second FBAR includes a bottom electrode and a top electrode sandwiching a piezoelectric layer.

3. The apparatus recited in claim 1 wherein the standoff is connected to a bottom electrode of said second FBAR.

4. The apparatus recited in claim 1 wherein said standoff is selected from the group consisting of tungsten and molybdenum.

5. The apparatus recited in claim 1 wherein said first FBAR is de-coupled from said second FBAR by air.

6. The apparatus recited in claim 1 wherein a distance between said first FBAR and said second FBAR is within a range from 0.1 microns to 20 microns.

7. The apparatus recited in claim 1 further comprising a third FBAR vertically separated above said second FBAR.

8. The apparatus recited in claim 1, wherein said first FBAR is suspended over a cavity in said substrate.

9. The apparatus recited in claim 8, further comprising at least one separator on said first FBAR to prevent said first FBAR and said second FBAR from touching each other under vibration.

10. An apparatus comprising:
a first film bulk acoustic resonator (FBAR) on a substrate;
a second FBAR above said first FBAR, said second FBAR being vertically separated from said first FBAR such that little or no acoustic energy is coupled between said first FBAR and said second FBAR;
at least one standoff fabricated directly on said first FBAR, said standoff supporting said second FBAR; and
wherein a top electrode of said first FBAR and a bottom electrode of said second FBAR are at different electrical potentials relative to each other thereby creating a capacitive potential between the top electrode of said first FBAR and the bottom electrode of said second FBAR.

11. The apparatus recited in claim 10
wherein said first FBAR includes a bottom electrode and a top electrode sandwiching a piezoelectric layer; and
wherein said second FBAR includes a bottom electrode and a top electrode sandwiching a piezoelectric layer.

12. The apparatus recited in claim 10 wherein the standoff is connected to a bottom electrode of said second FBAR.

13. The apparatus recited in claim 10 wherein said standoff is selected from the group consisting of silicon nitride and polysilicon.

14. The apparatus recited in claim 10 wherein said first FBAR is de-coupled from said second FBAR by air.

15. The apparatus recited in claim 10 wherein a distance between said first FBAR and said second FBAR is within a range from 0.1 microns to 20 microns.

16. The apparatus recited in claim 10 further comprising a third FBAR vertically separated above said second FBAR.

17. The apparatus recited in claim 10, wherein said first FBAR is suspended over a cavity in said substrate.

18. The apparatus recited in claim 17, further comprising at least one separator on said first FBAR to prevent said first FBAR and said second FBAR from touching each other under vibration.

* * * * *